(12) United States Patent
Korenaga et al.

(10) Patent No.: US 7,067,942 B2
(45) Date of Patent: Jun. 27, 2006

(54) LINEAR MOTOR, MOVING STAGE SYSTEM, EXPOSURE APPARATUS, AND DEVICE MANUFACTURING METHOD

(75) Inventors: Nobushige Korenaga, Utsunomiya (JP); Toshiya Asano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

(21) Appl. No.: 10/777,196

(22) Filed: Feb. 13, 2004

(65) Prior Publication Data

US 2004/0207271 A1 Oct. 21, 2004

(30) Foreign Application Priority Data

Feb. 13, 2003 (JP) .............. 2003-035268

(51) Int. Cl.
*H02K 41/00* (2006.01)
(52) U.S. Cl. ..................... 310/12
(58) Field of Classification Search .......... 310/12
See application file for complete search history.

(56) References Cited

U.S. PATENT DOCUMENTS

| | | | |
|---|---|---|---|
| 5,684,856 A | 11/1997 | Itoh et al. ............... 378/34 |
| 5,841,250 A | 11/1998 | Koreange et al. ........ 318/135 |
| 6,002,465 A | 12/1999 | Korenaga ............... 355/53 |
| 6,025,658 A | 2/2000 | Kamata ................. 310/12 |
| 6,037,680 A | 3/2000 | Korenaga et al. ........ 310/12 |
| 6,104,108 A * | 8/2000 | Hazelton et al. ......... 310/12 |
| 6,107,703 A | 8/2000 | Korenaga ............... 310/12 |
| 6,177,978 B1 | 1/2001 | Korenaga ............... 355/53 |
| 6,265,793 B1 | 7/2001 | Korenaga ............... 310/12 |
| 6,414,742 B1 | 7/2002 | Korenaga et al. ........ 355/53 |
| 6,479,991 B1 | 11/2002 | Korenaga .............. 324/226 |
| 2002/0117903 A1 | 8/2002 | Uchida ................. 310/12 |
| 2003/0007140 A1 | 1/2003 | Korenaga ............... 355/72 |
| 2003/0102723 A1 | 6/2003 | Korenaga ............... 310/12 |
| 2003/0217694 A1 | 11/2003 | Korenaga .............. 118/500 |

FOREIGN PATENT DOCUMENTS

JP        2002-325421        11/2002

\* cited by examiner

*Primary Examiner*—Karl Tamai
*Assistant Examiner*—Judson H. Jones
(74) *Attorney, Agent, or Firm*—Fitzpatrick, Cella, Harper & Scinto

(57) ABSTRACT

A linear motor including a coil, a plurality of first magnet groups having polar directions disposed in periodically different directions, and a plurality of second magnet groups having polar directions disposed in periodically different directions. In a set including a predetermined magnet of the first magnet groups and a magnet of the second magnet groups, corresponding to the predetermined magnet, magnetization directions of the set of magnets have mutually different tilts with respect to the central axis of the coil. The coil includes a first coil effective to produce a Lorentz's force between the first coil and the first magnet groups, and a second coil effective to produce a Lorentz's force between the second coil and the second magnet groups.

2 Claims, 3 Drawing Sheets

LINEAR MOTOR, MOVING STAGE SYSTEM, EXPOSURE APPARATUS, AND DEVICE MANUFACTURING METHOD

FIELD OF THE INVENTION AND RELATED ART

This invention relates to a linear motor suitably usable as a drive source for a stage system being incorporated into an exposure apparatus, for example, for producing semiconductor devices, for example. In other aspects, the invention concerns a stage system, an exposure apparatus, and a device manufacturing method, all using such a linear motor.

Japanese Laid-Open Patent Application No. 2002-325421, for example, shows a linear motor in which magnets and coils are moved relative to each other, by means of a Lorentz's force produced therebetween.

This linear motor comprises (i) a first magnet group having a plurality of first magnets disposed so that their polar directions are periodically opposed to each other and a plurality of second magnets disposed, in juxtaposition with the first magnets, so that their polar directions are periodically opposed to each other, and (ii) a second magnet group having a plurality of third magnets disposed so that their polar directions are periodically opposed to each other and a plurality of fourth magnets disposed, in juxtaposition with the first magnets, so that their polar directions are periodically opposed to each other, these components being connected integrally at the top and bottom surfaces of a holding member, respectively, to provide a movable element.

Also, there is a plurality of electromagnetic coils disposed opposed to the first and second magnet groups, to provide a stator. By applying an electrical current to these coils, a Lorentz's force as a thrust for driving the movable element is produced between the stator and the movable element.

SUMMARY OF THE INVENTION

Generally, in linear motors, by providing a coil and a magnet (permanent magnet) opposed to each other, a Lorentz's force as a thrust force is produced in the movement direction of a movable element. The inventor of the subject application has found that, between a movable element and a stator of a linear motor, there is a force additionally produced in a direction other than the thrust producing direction (movement direction of the movable element), and that such a force is seriously influential to the movable element. Specifically, such an unwanted force, being separate from the thrust force in the movement direction of the movable element, may function to move the movable element relative to the stator in a direction intersecting with the thrust producing direction, particularly, in a direction perpendicular to the thrust producing direction, thereby to cause a phenomenon that the movable element approaches toward the stator or contacts it. Additionally, such an unwanted force may function to cause a phenomenon that the movable element tilts relative to the stator.

Such a phenomenon as described above makes it difficult to assure high-precision control of the linear motor, and it results in a degraded positioning precision of a stage system that uses a linear motor.

It is, accordingly, an object of the present invention to provide a linear motor that enables high-precision control. Also, it is an object of the present invention to improve the positioning precision of a stage system that uses a linear motor.

The unwanted force different from the thrust force in the movement direction of the movable element may result from a phenomenon that the direction of magnetization or polarization of the magnet (direction of the magnetic flux vector from the N-pole to the S-pole) tilts with respect to the coil central axis and, consequently, the magnetic density distribution with respect to the coil becomes uneven between the upper and lower portions.

Here, as regards the coil central axis, in the case of a linear motor wherein, as in the aforementioned Japanese Laid-Open Patent Application No. 2002-325421, a plurality of coils are arrayed so that their end faces are placed in parallel to or substantially parallel to the thrust producing direction (movement direction of the movable element), it refers to a virtual line that contains a line passing through or substantially passing through the center of the coil and being perpendicular to or substantially perpendicular to the end face of the coil. The polar direction of the coil at the coil center is parallel to or substantially parallel to the coil central axis.

Thus, in the case of a linear motor wherein a plurality of coils are accumulated so that their end faces are placed perpendicularly to or substantially perpendicularly to the thrust producing direction (movement direction of the movable element), the coil central axis should refer to a virtual line that contains a line passing through or substantially passing through the center of the coil and intersecting or orthogonally intersecting a line which is perpendicular to or substantially perpendicular to the coil end face.

In accordance with the present invention, to achieve the above-described objects, there is provided a linear motor having a magnet and a coil, wherein a plurality of magnets are provided along the central axis direction of the coil, and the magnetization directions of the respective magnets have different tilts with respect to the central axis.

In accordance with the present invention, even if the magnetization direction of the magnet has a tilt with respect to the coil central axis, a force to be produced between a movable element and a stator in a direction other than the thrust producing direction can be reduced or avoided. Avoiding such a force may include a case wherein exactly no force is produced between the movable element and the stator in a direction other than the thrust producing direction, and a case wherein, although the force is produced, it does not have an adverse influence upon high precision control of the linear motor.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
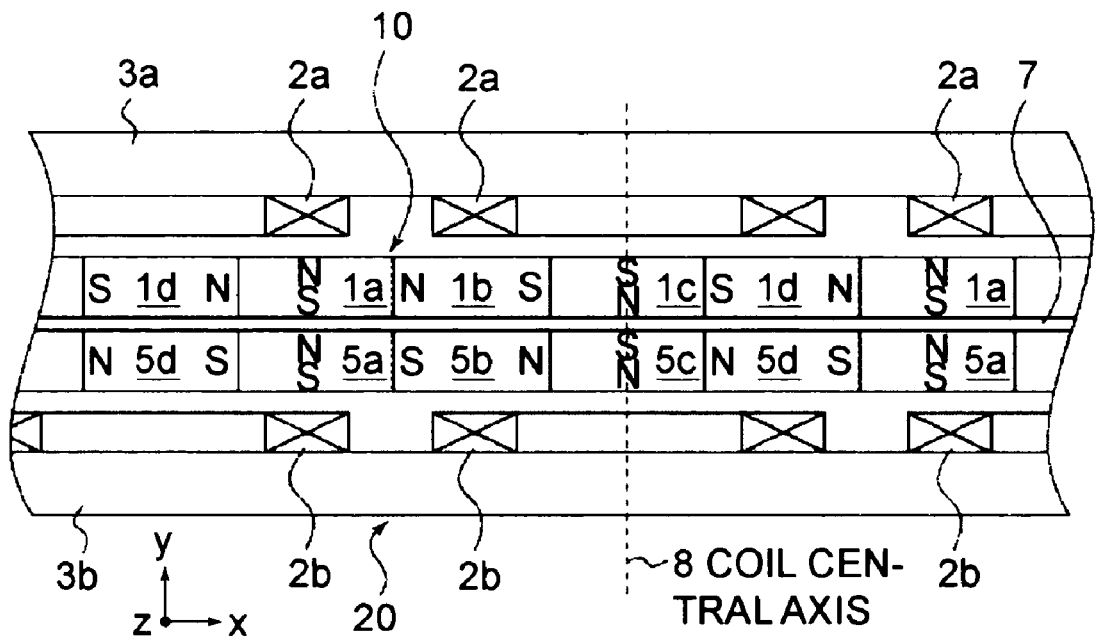
FIG. 1 is a schematic view for explaining a linear motor according to a first embodiment of the present invention.

FIG. 1 shows an embodiment of a linear motor which is arranged so that, with respect to an X-Y-Z coordinate system shown in the drawing, a movable element 10 is moved relative to a stator 20 in an X-axis direction.

The linear motor comprises first magnet groups (1a–1d) including first magnets 1a and 1c being arrayed with their polar directions placed periodically in opposite directions or placed in different directions, and second magnets 1b and 1d (permanent magnets) being arrayed with their polar directions placed periodically in opposite directions or placed in different directions and being alternately juxtaposed between the first magnets 1a and 1c. The magnets 1a–1d of the first magnet groups are disposed along the X-axis direction upon one surface of a holding member 7, made of a magnetic or a non-magnetic material, and they are integrally connected to each other. The design magnetization direction (direction of magnetic flux vector from the N-pole to the S-pole) of the first magnets 1a and 1c is placed parallel to the Y-axis direction, which is perpendicular to the X-axis direction (movement direction of the movable element 10). The design magnetization direction of the second magnets 1b and 1d is parallel to the X-axis direction.

Disposed on the other surface of the holding member 7 are second magnet groups (5a–5d) arrayed similarly along the X-axis direction. Like the first magnet groups, the second magnet groups include third magnets 5a and 5c being arrayed with their polar directions placed periodically in opposite directions or placed in different directions, and fourth magnets 5b and 5d (permanent magnets) being arrayed with their polar directions placed periodically in opposite directions or placed in different directions and being alternately juxtaposed between the third magnets 5a and 5c. The design magnetization direction (direction of magnet flux vector from the N-pole to the S-pole) of the third magnets 5a and 5c is placed parallel to the Y-axis direction, which is perpendicular to the X-axis direction (movement direction of the movable element 10). The design magnetization direction of the fourth magnets 5b and 5d is parallel to the X-axis direction.

As far as the design is concerned, the first magnets 1a and 1c and the third magnets 5a and 5c are placed so that their polar directions (magnetic flux vector from the N-pole to the S-pole) are oriented in the same direction. Also, as far as the design is concerned, the second magnets 1b and 1d and the fourth magnets 5b and 5d are placed so that their polar directions are oriented in opposite directions.

The movable element 10 of the linear motor comprises first magnet groups 1a–1d, second magnet groups 5a–5d, and a holding member. On the other hand, a stator 20 of the linear motor 20 comprises electromagnet coils 2a and 2b (coil means), and yokes 3a and 3b for fixedly holding the electromagnetic coils 2a and 2b, respectively. The electromagnetic coils 2a and 2b include a coil wound along an X-Z plane. A coil central axis 8 is a virtual line that contains a line passing through or substantially passing through the center of the coils 2a and 2b and being perpendicular to or substantially perpendicular to the end face of the coil (which is parallel to or substantially parallel to the X-Z plane). The polar direction of the coil at the center of the coils 2a and 2b is parallel to or substantially parallel to the coil central axis 8.

There is a plurality of upper electromagnetic coils 2a disposed opposed to the first magnet groups 1a–1d, and there is a plurality of lower electromagnetic coils 2b disposed opposed to the second magnet groups 5a–5d. The yoke 3a is provided at one side of the electromagnetic coil 2a remote from the magnets. The yoke 3b is provided at one side of the electromagnetic coil 2b remote from the magnets. The plurality of electromagnetic coils 2a fixed to the yoke 3a are disposed with mutual deviations of 90 deg., 180 deg., 270 deg. and 360 deg., in terms of electrical angle. The plurality of electromagnetic coils 2b fixed to the yoke 3b are disposed with mutual deviations of 90 deg., 180 deg., 270 deg. and 360 deg., in terms of electrical angle.

By applying an electrical current to the electromagnetic coils 2a and 2b at the stator 20 side, a Lorentz's force (thrust force) is produced between the coil and the magnetic groups 1a–1d and 5a–5d at the movable element 10 side, in the X-axis direction (movement direction of the movable element).

It is to be noted here that, in this embodiment, the magnets 1a–1d and 5a–5d may be provided at the linear motor stator side, while the electromagnetic coils 2a and 2b may be provided upon the movable element. Further, in place of providing coils 2a and 2b at the opposite sides of the magnets 1a–1d and 5a–5d, the magnets 1a–1d and the magnets 5a–5d may be disposed separately with respect to the Y-axis direction, and coils 2a (or 2b) may be disposed between them. The present invention is applicable also to such a linear motor structure.

Even in this embodiment, the magnetization direction of the first magnets 1a and 1c and the third magnets 5a and 5c, in other words, the vector direction extending from the N-pole to the S-pole, is designed to be parallel to the Y-axis direction (i.e., the coil central axis 8). However, the inventor of the subject application has found that, actually, the structure may not exactly follow the design and that the magnetization direction may tilt in an arbitrary direction with respect to the Y-axis direction.

If this occurs, a difference in magnetic flux density distribution is produced between the region where the upper electromagnetic coil 2a is present and the region where the lower electromagnetic coil is present, and it results in the production of a thrust force in the Y direction, in addition to the thrust in the X-axis direction, as well as the production of a rotational force around the Z axis.

Figure 2:
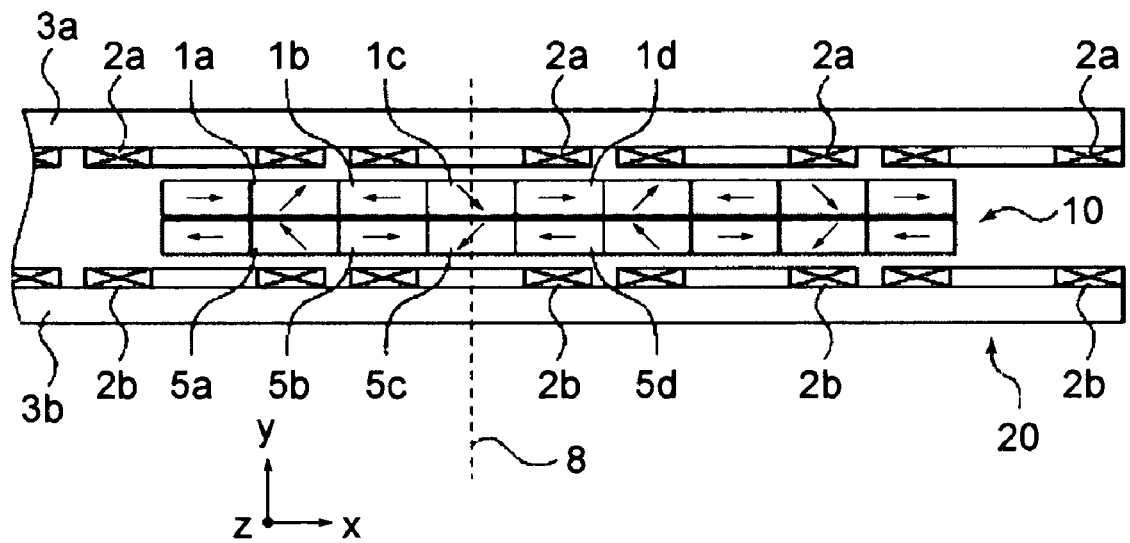
FIG. 2 is a schematic view of a main portion of the first embodiment of the present invention.

This embodiment has a structure, as shown in FIG. 2, that is effective to suppress, reduce or avoid the production of such an unwanted force, other than the thrust to the movable element 10. In FIG. 2, the magnetization direction of the magnet 1c has a certain counterclockwise tilt along the X-Y plane, with respect to the design magnetization directions, which is parallel to or substantially parallel to the coil central axis 8 (Y-axis direction). Also, the magnetization direction of the magnet 5c has a certain clockwise tilt along the X-Y plane, with respect to the design magnetization direction, which is parallel to or substantially parallel to the coil central axis 8 (Y-axis direction). Thus, the magnetization directions of the magnets 1c and 5c have different tilts with respect to the coil central axis 8, or alternatively, they are tilted differently.

With this arrangement, the magnetic flux density distribution in the region where the electromagnetic coil 2a is present and the magnetic flux density distribution in the region where the electromagnetic coil 2b is present can be adjusted to be registered or substantially registered with each other. By means of this adjustment, even if a thrust force in the Y direction other than that in the X-direction or a rotational force about the Z-axis is produced at one of the electromagnetic coil 2a side and the electromagnetic coil 2b side, the magnetization direction of the magnet at the other side can be tilted to completely cancel or substantially cancel that thrust force. Here, substantial cancellation means reducing the thrust in the Y direction or rotational force about the Z-axis to a level that has substantially no influence upon the movement of the movable element 10 in the X-axis direction.

Here, it should be noted that this embodiment may preferably be structured so that the total sum of the tilts of the magnetization directions of the magnets 1c and 5c with respect to the coil central axis 8 becomes approximately null. Furthermore, when, in the X-Y plane, the tilt of the magnetization direction of the magnet 1c with respect to the coil central axis 8 is denoted by $\Delta\theta 1$ and the tilt of the magnetization direction of the magnet 5c with respect to the coil central axis 8 is denoted by $(-\Delta\theta 5)$, preferably, the sum of the tilt $\Delta\theta 1$ and the tilt $-\Delta\theta 5$ is made equal to or approximately equal to zero.

The adjustment of the magnetization direction of the magnets 1c and 5c with respect to the coil central axis 8 is performed by using an adjusting mechanism (not shown) provided at the holding member 7 or, alternatively, an adjusting member sandwiched between the magnets 1c and 5c, to thereby rotate or tilt at least one of the magnets 1c and 5c about at least one of the X, Y and Z axes. The magnets 1a and 5a may preferably be adjusted into a similar relationship.

Figure 3:
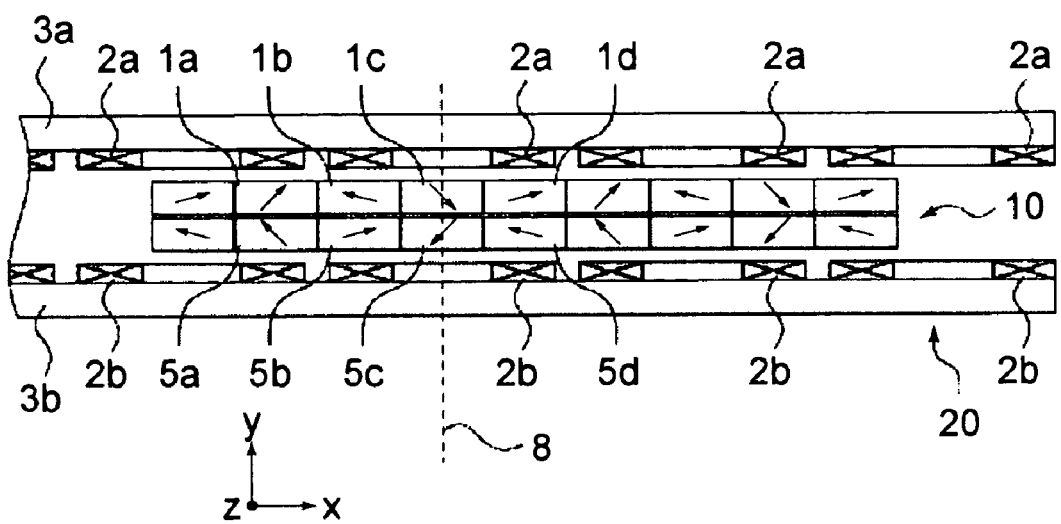
FIG. 3 is a schematic view of a main portion of a second embodiment of the present invention.

FIG. 3 shows a second embodiment. This embodiment differs from the first embodiment in that the adjustment of magnetization direction is performed also with regard to a set of the magnets 1b and 5b and a set of the magnets 1d and 5d. A duplicate description of similar structures and functions as those of the first embodiment will now be omitted.

This embodiment has a structure, as shown in FIG. 3, that is effective to suppress, reduce or avoid the production of an unwanted force, other than the thrust to the movable element 10. In FIG. 3, the magnetization direction of the magnet 1b has a certain clockwise tilt along the X-Y plane, with respect to the design magnetization direction, which is parallel to or substantially parallel to, a direction (X-axis direction) orthogonal to the coil central axis 8 (Y-axis direction). Also, the magnetization direction of the magnet 5d has a certain counterclockwise tilt along the X-Y plane, with respect to the design magnetization direction, which is parallel to or substantially parallel to a direction (X-axis direction) orthogonal to the coil central axis 8 (Y-axis direction). Thus, the magnetization directions of the magnets 1b and 5b have different tilts with respect to the coil central axis 8, or alternatively, they are tilted differently.

In other words, the magnetization directions of the magnets 1b and 5b differ from each other, with certain tilts in opposite directions, along the X-Y plane, from a direction parallel to or substantially parallel to the coil central axis 8 (Y-axis direction).

With this arrangement, the magnetic flux density distribution in the region where the electromagnetic coil 2a is present and the magnetic flux density distribution in the region where the electromagnetic coil 2b is present can be adjusted to be registered or substantially registered with each other. By means of this adjustment, even if a thrust force in the Y direction other than that in the X-axis direction or a rotational force about the Z-axis is produced at one of the electromagnetic coil 2a side and the electromagnetic coil 2b side, the magnetization direction of the magnet at the other side can be tilted to completely cancel or substantially cancel it. Here, substantial cancellation means reducing the thrust in the Y direction or rotational force about the Z-axis to a level that has substantially no influence upon the movement of the movable element 10 in the X-axis direction.

Here, it should be noted that this embodiment may preferably be structured so that the total sum of the tilts of the magnetization directions of the magnets 1b and 5b with respect to the coil central axis 8 becomes approximately null. Furthermore, when in the X-Y plane the tilt of the magnetization direction of the magnet 1b with respect to the coil central axis 8 is denoted by $\Delta\theta 1$ and the tilt of the magnetization direction of the magnet 5b with respect to the coil central axis 8 is denoted by $(-\Delta\theta 5)$, preferably, the sum of the tilt $\Delta\theta 1$ and the tilt $-\Delta\theta 5$ is made equal to or approximately equal to zero.

The adjustment of the magnetization direction of the magnets 1b and 5b with respect to the coil central axis 8 is performed by using an adjusting mechanism (not shown) provided at the holding member 7 or, alternatively, an adjusting member sandwiched between the magnets 1b and 5b, to thereby rotate or tilt at least one of the magnets 1b and 5b about at least one of the X, Y and Z axes. The magnets 1d and 5d may preferably be adjusted into a similar relationship.

In the embodiments described above, two magnets are disposed along the coil central axis and they are placed with their magnetization directions tilted differently. However, three or more magnets may be disposed along the coil central axis to perform the adjustment for reducing the thrust in the Y direction or rotational force about the Z axis.

Figure 4:
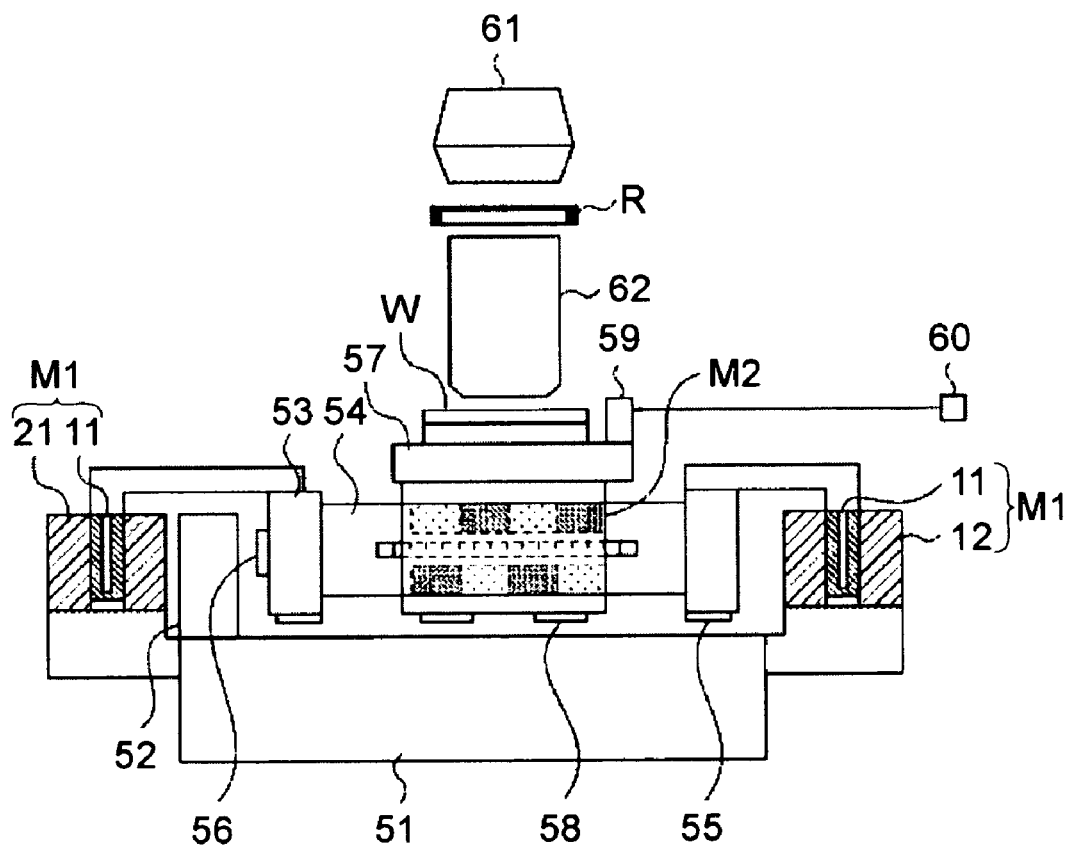
FIG. 4 is a schematic view of an example of an exposure apparatus into which a linear motor according to the present invention can be incorporated.

FIG. 4 shows a semiconductor device manufacturing exposure apparatus having a stage system, as a wafer stage, in which linear motors M1 and M2, such as described above, are incorporated as a driving means.

This exposure apparatus can be used for the manufacture of microdevices, such as semiconductor devices (e.g., semiconductor integrated circuits), micromachines, thin-film magnetic heads, for example, having a fine pattern formed thereon. In this exposure apparatus, a reticle R is projected upon a semiconductor wafer W (substrate) by projecting exposure light (a generic term for visible light, ultraviolet light, EUV light, X-rays, an electron beam, and a charged particle beam, for example) from a light source 61, through a projection lens (a generic term for a dioptric lens, a catoptric lens, a catadioptric lens system, and a charged particle lens, for example) 62, which is a projection optical system, whereby a desired pattern is produced on the substrate.

This exposure apparatus has a guide 52 and a linear motor stator 21 fixedly mounted on a base table 51. As with the example described hereinbefore, the linear motor stator 21 has multiple-phase electromagnetic coils, while a linear motor movable element 11 has permanent magnet groups. The linear motor movable element 11 (moving portion 53) is connected to a movable guide 54 (stage). Through the drive of the linear motor M1, the movable guide 54 is moved in a direction normal to the sheet of the drawing. The movable portion 53 is supported by static bearing means 55 with reference to the top face of the base table 51, and it is supported by static bearing means 56 with reference to the side face of the guide.

A moving stage 57, which is a stage that straddles the movable guide 54, is supported by static bearing means 58. This moving stage 57 is driven by the linear motor M2 as with the motor described above. Thus, the moving stage 57 is moved horizontally as seen in the sheet of the drawings, with reference to the movable guide 54. The motion of the moving stage 57 is measured by using a mirror 59 fixedly mounted on the moving stage 57 and an interferometer 60.

A wafer W (substrate) is held by a chuck that is mounted on the moving stage 57, such that a pattern of the reticle R is transferred in a reduced scale onto different regions of the wafer W in a step-and-repeat or step-and-scan method, by means of a light source 61 and a projection optical system 62.

Here, it should be noted that the linear motor of the present invention is similarly applicable to an exposure apparatus of the type that a circuit pattern is directly drawn on a semiconductor wafer without using a mask, to thereby expose a resist thereon.

Next, an embodiment of a device manufacturing method, which uses an exposure apparatus such as described above, will be explained.

Figure 5:
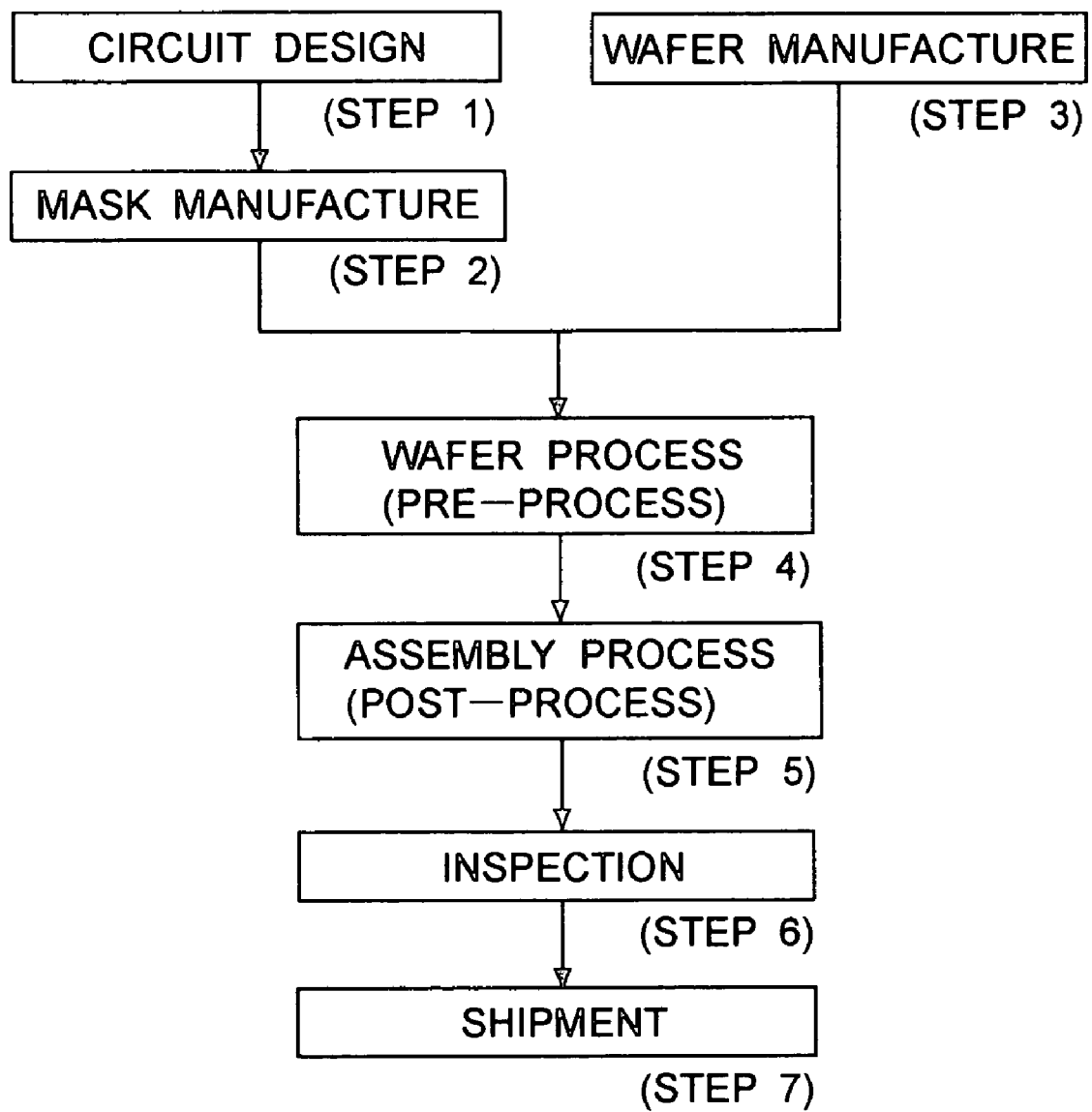
FIG. 5 is a flow chart for explaining device manufacturing processes.

FIG. 5 is a flow chart for explaining a general procedure for the production of semiconductor devices. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembly step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

The wafer process described above includes an oxidation process for oxidizing the surface of a wafer, a CVD process for forming an insulating film on the wafer surface, an electrode forming process for forming electrodes upon the wafer by vapor deposition, an ion implanting process for implanting ions to the wafer, a resist process for applying a resist (photosensitive material) to the wafer, and an exposure process for printing, by exposure, the circuit pattern of the mask on the wafer through the exposure apparatus described above. Also, it includes a developing process for developing the exposed wafer, an etching process for removing portions other than the developed resist image, and a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A linear motor comprising:
   a coil;
   a plurality of first magnet groups having polar directions disposed in periodically different directions; and
   a plurality of second magnet groups having polar directions disposed in periodically different directions;
   wherein, in a set including a predetermined magnet of said first magnet groups and a magnet of said second magnet groups, corresponding to the predetermined magnet, magnetization directions of the set of magnets have mutually different tilts with respect to the central axis of said coil, and
   wherein said coil includes a first coil effective to produce a Lorentz's force between said first coil and said first magnet groups, and a second coil effective to produce a Lorentz's force between said second coil and said second magnet groups.

2. A linear motor according to claim 1, further comprising a first yoke provided at a side of said first coil remote from said first magnet groups, and a second yoke provided at a side of said second coil remote from said second magnet groups.

* * * * *